(12) United States Patent
Hassan

(10) Patent No.: US 6,581,179 B1
(45) Date of Patent: Jun. 17, 2003

(54) METHODS FOR GENERATING SIDE INFORMATION IN THE PRESENCE OF TIME-SELECTIVE FADING

(75) Inventor: Amer A. Hassan, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 08/669,937

(22) Filed: Jun. 25, 1996

(51) Int. Cl.⁷ .............................................. H03M 13/45

(52) U.S. Cl. ...................................... 714/776; 714/780
(58) Field of Search ........................... 371/37 A, 37.01, 371/37.9, 37.02, 37.06; 714/776, 780

(56) References Cited

U.S. PATENT DOCUMENTS

| | | | |
|---|---|---|---|
| 4,611,333 A | | 9/1986 | McCallister et al. ............ 375/1 |
| 5,048,057 A | * | 9/1991 | Saleh et al. .................... 375/40 |
| 5,088,113 A | * | 2/1992 | Wei .............................. 375/53 |
| 5,121,395 A | * | 6/1992 | Millar ........................ 371/39.1 |
| 5,206,864 A | * | 4/1993 | McConnell ................. 371/37.4 |
| 5,241,544 A | * | 8/1993 | Jasper ...................... 370/105.3 |
| 5,289,471 A | | 2/1994 | Tanaka et al. .............. 370/95.3 |
| 5,442,646 A | * | 8/1995 | Chadwick et al. ............ 371/43 |
| 5,659,578 A | * | 8/1997 | Alamouti et al. ........... 375/261 |

FOREIGN PATENT DOCUMENTS

| | | |
|---|---|---|
| EP | 0 535 812 A | 4/1993 |
| EP | 0664625 | 12/1994 |
| EP | 0 671 824 A | 9/1995 |
| WO | 87/01490 | 3/1987 |

OTHER PUBLICATIONS

Boyd et al., "A Concatenated Coding Approach for High Data Rate Applications", NTC '77 Conference Record, vol. 3, 1978, pp. 36:2–1 to 36:2–7, Jan. 1978.*

Hassan et al., "On Decoding Concatenated Codes", IEEE Transactions on Information Theory, vol. 36, No. 3, May 1990, pp. 677–683.*

Hsuan et al., "Erasing Gains for Concatenated Codes", IEE Proc.–Commun., vol. 142, No. 3, Jun. 1995, pp. 121–128.*

Wozencraft et al., *Principles of Communication Engineering*, John Wiley and Sons (1965).

Viterbi et al., "Advances in Coding and Modulation for Noncoherent Channels Affected by Fading, Partial–Band, and Multiple–Access Interference," *Advances in Communications Systems*, vol. 4, pp. 279–308.

Stark, "Capacity and Cutoff Rate of Noncoherent FSK with Nonselective Rician Fading," IEEE Trans. Commun., vol. COM–33, pp. 1036–1044 (Sep. 1995).

Pursley, "Packet Error Probabilities in Frequency–Hop Radio Networks– Coping with Statistical Dependence and Noisy Side Information," IEEE Global Telecommun. Conf. Record, vol. 1, pp. 165–170, (Sec. 1986).

(List continued on next page.)

Primary Examiner—Stephen M. Baker
(74) Attorney, Agent, or Firm—Myers Bigel Sibley & Sajovec

(57) ABSTRACT

A method and apparatus for decoding digitally encoded communication signals transmitted over a fading channel. According to the disclosed embodiments, a sequence of test bits are transmitted in each TDMA slots, and a mathematical distance (e.g., a Hamming or Euclidean distance) is calculated and used to determine reliability information indicative of the reliability of the bits or symbols in a received time slot. Alternatively, a concatenated coding scheme can be used to transmit digital communication signals. Reliability information can be generated using the inner code and the output of the inner decoder.

8 Claims, 2 Drawing Sheets

OTHER PUBLICATIONS

McEliece et al., "Channels with Block Interference," IEEE Transaction on Inform. Theory, vol. IT–30, No. 1 (Jan. 1984).

Pursley, "Tradeoffs between Side Information and Code–Rate in Slow–Frequency Hop Packet Radio Networks," Conf. Record, IEEE Int'l. Conf. on Communications (Jun. 1987).

Hassan, "Performance of a Coded FHSS System in Rayleigh Fading," Proceedings of the 1988 Conference on Information Sciences and Systems.

Lin and Costello, *Error Control Coding: Fundamentals and Applications*, Chapter 6, available from Prentice Hall Publishers.

* cited by examiner

METHODS FOR GENERATING SIDE INFORMATION IN THE PRESENCE OF TIME-SELECTIVE FADING

FIELD OF THE INVENTION

The present invention relates generally to communication systems. More particularly, the present invention relates to the decoding of encoded digital communication signals transmitted over a fading channel by generating side (reliability) information at the receiver.

BACKGROUND OF THE INVENTION

In TDMA (time-dimension multiple access) and other communications system, Rayleigh fading can present significant problems. Reliable communication over fading channels requires a large bit energy to noise ratio $$\frac{E_b}{N_o}.$$

It is known that when communicating over a fading channel, the uncoded bit error rate (BER) decreases inverse linearly, rather than exponentially, with $$\frac{E_b}{N_o}.$$

See, for example, Wozencraft et al., *Principles of Communication Engineering*, John Wiley and Sons (1965). While a desirably low error probability of $10^{-5}$ can be achieved with a signal margin of only 13.4 dB for a noncoherent channel with no fading using binary orthogonal signaling, a signal margin of approximately 50 dB is required for a fading channel. See, for example, Viterbi et al., "Advances in Coding and Modulation for Noncoherent Channels Affected by Fading, Partial-Band, and Multiple-Access Interference," *Advances in Communications Systems*, vol. 4, pp.279–308. Fading can also cause a loss in capacity and a reduced channel cutoff rate, as described in Stark, "Capacity and Cutoff Rate of Noncoherent FSK with Nonselective Rician Fading," IEEE Trans. Commun., vol. COM-33, pp.1036–44 (September 1995).

To compensate for the signal and capacity loss of fading, most communication systems use some form of error-correction coding. For fading channels, most of the loss incurred from fading can be recovered using diversity (repetition) coding with some optimally-selected coding rate. For example, a repetition coding scheme can reduce the required signal margin necessary to achieve an error probability of $10^{-5}$ from 50 dB to about 22 dB.

In a fading time-selective TDMA communication system, more than one data symbol is transmitted per time slot. If the system uses some form of coding, it is desirable to obtain information concerning the reliability of the symbols in a particular time slot, erase unreliable symbols, and use errors-and-erasures correction decoding. Such reliability information can include, for example, information indicative of the number of errors in a particular transmission, "soft" information used to decode the transmitted information, and other types of information. Thus, it is desirable to develop practical techniques for generating reliability information during each time slot.

The most common techniques for obtaining reliability information about a channel for coded communications systems fall generally into two categories: pre-detection techniques and post-detection techniques. Such techniques are described in for example, Pursley, "Packet Error Probabilities in Frequency-Hop Radio Networks-Coping with Statistical Dependence and Noisy Side Information," IEEE Global Telecommun. Conf. Record, vol. 1, pp.165–70, (Sec. 1986). Pre-detection techniques are usually complex, involving methods such as energy detection or channel monitoring, and are therefore undesirable. Among Post-detection techniques, McEliece et al., "Channels with Block Interference," IEEE Transaction on Inform. Theory, vol. IT-30, no. 1 (January 1984) suggested the transmission of test bits to learn about the channel. This method was applied to frequency-hopped multiple access channel to detect the presence of a bit in a given time slot in Pursley, "Tradeoffs between Side Information and Code-Rate in Slow-Frequency Hop Packet Radio Networks," Conf. Record, IEEE Int'l. Conf. on Communications (June 1987). Similar techniques have been used to generate reliability information concerning a hop in a frequency-hopping spread-spectrum communication system in the presence of fading, as suggested in Hassan, "Performance of a Coded FHSS System in Rayleigh Fading," Proceedings of the 1988 Conference on Information Sciences and Systems. Similarly, test bits can be used for carrier recovery and synchronization purposes. All of these methods described above involve making "hard" decisions on the test bits, resulting in a loss of power. In a conventional hard decision case, the receiver makes hard decisions on the test bits T. If more than a threshold number or percentage of the test bits in a timeslot are in error, then the detector declares all of the data symbols D transmitted during that slot as "bad", and generates erasures for all symbols in the bad slot. If fewer than the threshold number are in error, then the detector declares all symbols transmitted during the slot as "good", and delivers the corresponding estimates to the decoder. The performance measure of interest in the hard decision case is the probability of bit error, and the threshold must be chosen to minimize this probability. It would be desirable to reduce power loss in a practical, relatively simple method for generating reliability information.

SUMMARY OF THE INVENTION

According to exemplary embodiments of the present invention, side (reliability) information indicative of the reliability of the data transmitted in a time slot in a coded TDMA communication system subject to time-selective Rayleigh fading is generated by performing soft decisions to decode test bits. According to a first method, transmitted test bits known to the receiver are included in each slot, and a mathematical distance, such as the Euclidean or Hamming distance between the transmitted known test bit sequence and the corresponding received sequence, is determined by the receiver to decide whether the corresponding slot is reliable or not reliable. Alternatively, the channel state during a slot interval can be determined in a system which uses concatenated codes. According to this embodiment, the inner code is used to generate the information about the reliability of the data received over a channel. Significant enhancement in system performance, particularly with respect to the signal-to-noise ratio, is possible using the techniques of the present invention.

BRIEF DESCRIPTION OF THE DRAWINGS

The present invention can be understood more fully by reading the following Detailed Description of the Preferred Embodiments in conjunction with the attached drawings, in which like reference indicia indicate like elements, and in which.

DETAILED DESCRIPTION OF THE PREFERRED EMBODIMENTS

Figure 1:
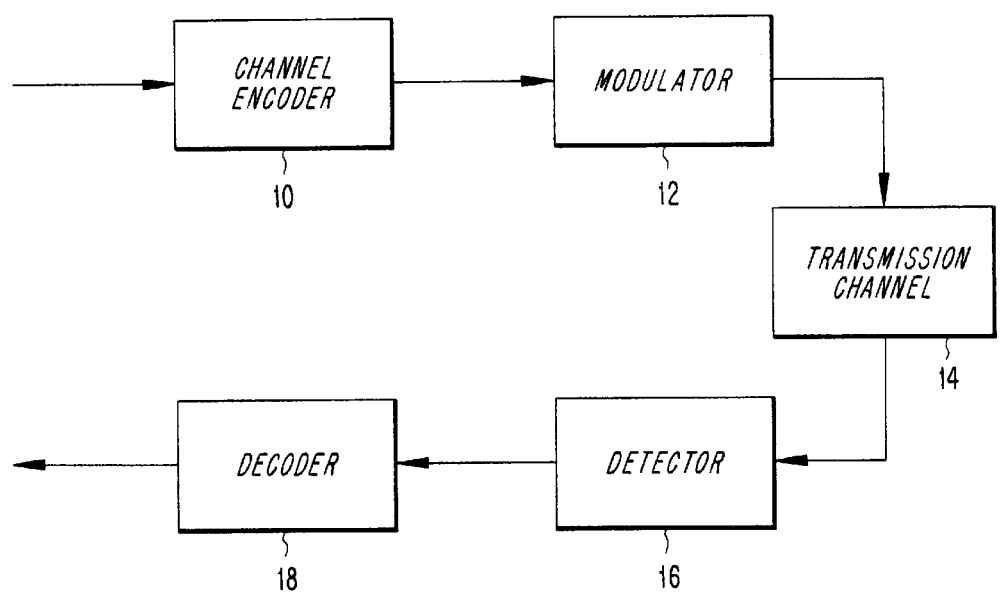
FIG. 1 is a block diagram of an exemplary communication system for transmitting encoded digital communication signals, in which the method of the present invention can be used.

Referring now to FIG. 1, an exemplary communication system for transmitting encoded digital communication signals, in which the method of the present invention can be implemented, is shown. The system includes a channel encoder 10 for encoding digital data bits or symbols to be transmitted, a modulator 12 for modulating the encoded data symbols and transmitting the symbols over a transmission channel 14 to a receiver, a detector 16 for detecting/demodulating the receiver, and a decoder 18 for decoding the detected data symbols. The encoded, modulated symbols are preferably transmitted using time-division multiple access (TDMA), in which the symbols are transmitted in frames, each frame including multiple time slots. In a TDMA system, a communication channel is defined as one or more time slots in each frame which are assigned for use by a communicating transmitter and receiver. Each time slot contains numerous encoded bits or symbols. It will be appreciated that the present invention is applicable to other communication methods as well.

Figure 2:
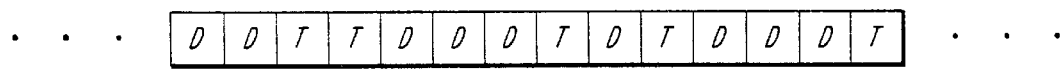
FIG. 2 is a diagram of an exemplary test bit pattern contained in a TDMA burst.

According to a first embodiment of the present invention, reliability information is generated by transmitting a known pattern of test bits or symbols, and using soft decisions to decode the test bits. An exemplary pattern of symbols transmitted in a time slot is shown in FIG. 2. Such a pattern can be encoded in channel encoder 10, modulated in modulator 12, and transmitted over transmission channel 14. Three types of symbols are transmitted in each time slot: information symbols, redundant symbols, and a set of known binary test symbols T. Collectively, the information symbols and the redundant symbols are referred to as data symbols D. The detector 16 determines the mathematical distance (e.g., Euclidean or Hamming) between the known pattern of transmitted test bits and the received test bits, compares the distance to a threshold, and generates an indication of the reliability of the data symbols in that time slot, based on the comparison. This indication of reliability can be used to indicate to the decoder that the data bits contained in a time slot are correct or incorrect. Thus, a mathematical distance measure between the test bits as transmitted and as received is used instead of hard decision trellis pruning. The test bits are most preferably interleaved within each time slot, as shown in FIG. 2. Interleaving and deinterleaving can be performed by a suitable known interleaver and deinterleaver (not shown in FIG. 1).

Each symbol output by the detector 16, in addition to the reliability information, to the decoder 18 is one of three types: a correct symbol, an erroneous symbol, or an erasure (loss of data). The decoder 18 preferably corrects the errors and erasures, and outputs information estimates for conversion to speech signals. If the error-and-erasure correcting capability of the particular code or codes is exceeded, the decoder fails, and the receiver outputs the information symbols of the vector received from detector 16, including errors and erasures.

Alternatively, two decoders can be used in parallel, with a selector to choose the output of one of the decoders. According to such an embodiment, one decoder is used for errors-and-erasures correction, and the other decoder is used only to correct errors. Using such a scheme, when the error-and-erasures decoder fails to decode because the error and erasure correcting abilities of the code have been exceeded, the error correction decoder is selected to output the correct codeword. If both decoders fail, the receiver preferably outputs the information symbols of the received vector, including errors and erasures.

Figure 3:
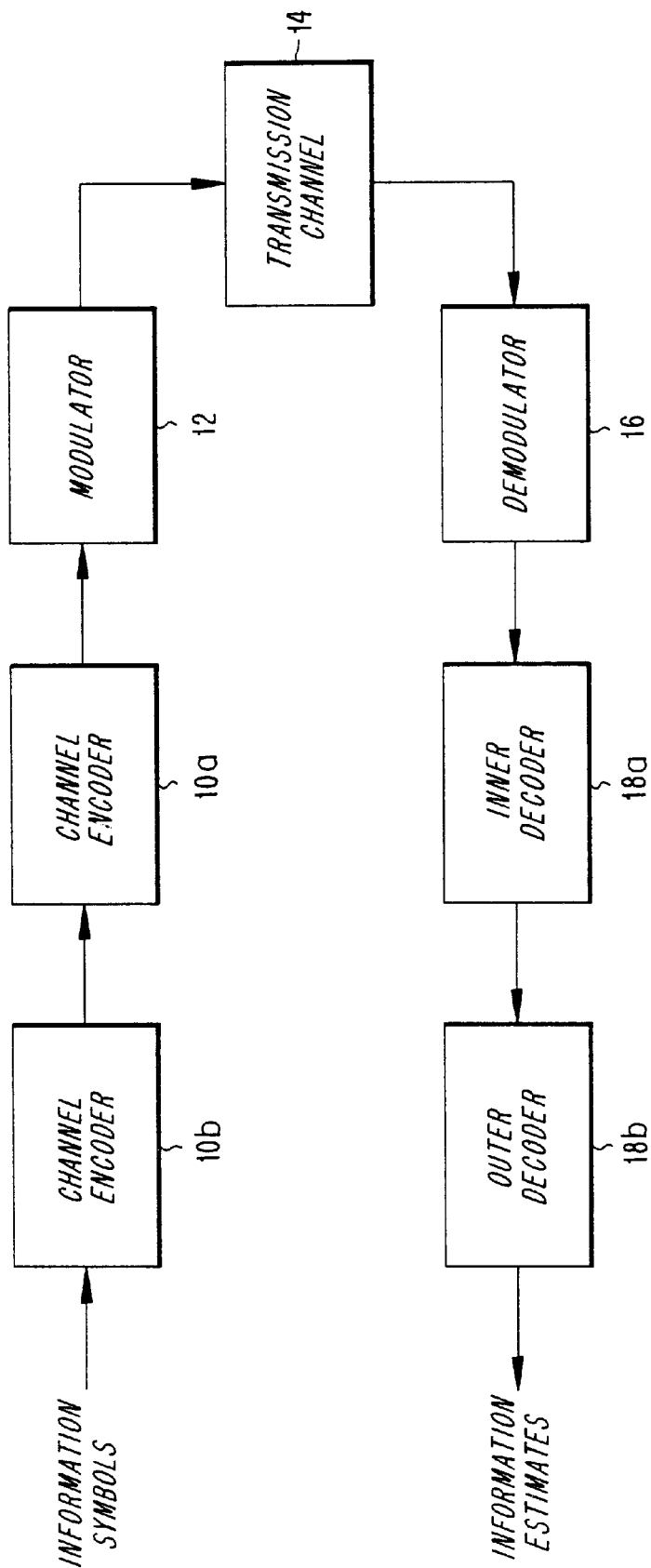
FIG. 3 is a block diagram of an exemplary communication system employing concatenated coding, in which the method of the present invention can be used.

According to an alternative embodiment as shown in FIG. 3, a concatenated coding scheme is used. That is, two encoders 10$a,b$ and two decoders 18$a,b$ are used to perform encoding and decoding in two stages, respectively. The second (inner) encoder 10$a$ further encodes the symbols encoded by first (outer) encoder 10$b$ in each slot. The concatenated coded system of FIG. 3 preferably interleaves the outer code, and each inner-codeword is transmitted over a fixed channel. The system preferably uses the inner code to detect and correct errors, as will now be described. In a conventional hard decision decoder, the inner code corrects e errors and detects f errors (e≦f) provided e+f<$d_{1H}$, where $d_{1H}$ is the minimum Hamming distance of the inner code. In the soft decision decoding scheme of the present invention, the inner code corrects all corrupted codewords or error patterns within a threshold mathematical (e.g., Euclidean or Hamming) distance $\Delta$ from a codeword, and otherwise outputs an erasure. The inner decoder may be used for detection of errors, correction of errors, or both. If the inner decoder is used for detection of errors only, then each erroneous symbol of the inner code will cause the outer decoder to generate an erasure. To correct errors that are not detected nor corrected by the inner code, the outer code preferably also corrects errors and erasures. The outer code is preferably a Reed-Solomon code, but it will be appreciated that other suitable codes can be used.

An example will now be described where a stream of data includes a fraction $\alpha$ which is channel encoded with a rate $r_1$ code and a fraction 1–$\alpha$ encoded with a rate $r_2$ code. Then the effective total rate $r_e$ is:

$$r_e = \frac{1}{\frac{\alpha}{r_1} + \frac{1-\alpha}{r_2}}$$

It will be appreciated that this example can be extended to a multi-rate coding scheme using this equation. The stream of data is assumed to be a frame in a time slot assigned to a single user in a TDMA system. For a half-rate coder in a TDMA system, a bandwidth expansion factor of 1/0.7 (6.5/4.5) or less is tolerable; i.e., $r_e$=0.7. If only a portion of the data is to be protected, then $r_2$=1 and $$r_1 \geq \frac{7\alpha}{3+7\alpha}$$

If $\alpha$=¼, then a code rate $r_1 \geq 0.37$ can be used. Thus for a concatenated coding system with a Reed-Solomon outer code and an extended Hamming (8,4) inner code, capable of correcting one error and detecting 2 errors, the Reed-Solomon code rate is around 0.74 (0.37/0.5).

Such a scheme can be implemented as follows. Outer encoder 10$b$ encodes every fourth bit with a Reed-Solomon (15,11) outer code. This code operates over Galois-Field $GF(2^4)$ with 4-bit symbols. Each outer code symbol is further encoded by inner encoder 10a using an extended Hamming code which corrects one error and detects two errors. If the inner decoder 18a detects errors, then the corresponding Reed-Solomon symbol is considered unreliable, and the inner decoder 18a informs the outer decoder 18b of this unreliability. The outer decoder 18b uses this soft information to correct e errors and r erasures such that $2e+r \leq 4$. A suitable algorithm is the Berlekamp-Massey bounded-distance decoding algorithm including Galois field calculations as described in, e.g., Lin and Costello, *Error Control Coding: Fundamentals and Applications,* Chapter 6, available from Prentice Hall Publishers. It will be appreciated that other decoding algorithms can be used.

The inner decoder 18a can be implemented by a soft decision or a maximum-likelihood decoder.

While the foregoing has included many details and specificities, it is to be understood that these are merely for purposes of explanation, and are not to be construed as limitations of the invention. Many modifications will be readily apparent to those of ordinary skill in the art which do not depart from the spirit and scope of the invention, as defined by the following claims and their legal equivalents.

What is claimed is:

1. A method for generating reliability information indicative of the reliability of data transmitted over a TDMA communication channel, comprising the steps of:

transmitting one or more of a sequence of test bits in each time slot of the TDMA communication channel, the test bits being known to the receiver prior to the step of transmitting;

determining, at the receiver, a mathematical distance between the sequence of test bits as known to the receiver and the sequence of test bits as received by the receiver; and generating, at the receiver, reliability information indicative of the reliability of data transmitted over the TDMA communication channel based on the mathematical distance, and information estimates of the transmitted data;

wherein the mathematical distance is a Euclidean distance.

2. The method of claim 1, further comprising the steps of:

interleaving the test bits with information symbols within each time slot prior to the step of transmitting; and deinterleaving the reliability information and the information estimates.

3. A method of generating reliability information indicative of the reliability of data transmitted over a TDMA communication channel, comprising the steps of:

transmitting one or more of a sequence of test bits in each time slot of the TDMA communication channel, the test bits being known to the receiver prior to the step of transmitting;

determining, at the receiver, a mathematical distance between the sequence of test bits as known to the receiver and the sequence of test bits as received by the receiver;

generating, at the receiver, reliability information indicative of the reliability of data transmitted over the TDMA communication channel based on the mathematical distance, and information estimates of the transmitted data;

generating a sequence at the receiver, the sequence including correct symbols, errors, and erasures; and correcting the errors and erasures to generate the information estimates when the number of errors and erasures does not exceed a threshold value, and outputting the sequence as the information estimates when the number of errors and erasures exceeds the threshold value.

4. The method of claim 3, wherein the mathematical distance is a Hamming distance.

5. A method for generating reliability information indicative of the reliability of data transmitted over a TDMA communication channel, comprising the steps of:

transmitting one or more of a sequence of test bits in each time slot of the TDMA communication channel, the test bits being known to the receiver prior to the step of transmitting;

determining, at the receiver, a mathematical distance between the sequence of test bits as known to the receiver and the sequence of test bits as received by the receiver;

generating, at the receiver, reliability information indicative of the reliability of data transmitted over the TDMA communication channel based on the mathematical distance, and information estimates of the transmitted data;

generating a sequence at the receiver, the sequence including correct symbols, errors, and erasures; and correcting errors and erasures in a first decoder when the sequence includes erasures, and correcting errors in a second decoder when the decoder sequence includes no erasures or when an error and erasure correction capacity of the first decoder has been exceeded.

6. A communication system, comprising:

a receiver; and a transmitter for transmitting a TDMA communication signal including one or more of a sequence of test bits to the receiver in each time slot of a TDMA communication channel, the test bits being known to the receiver;

wherein the receiver determines a mathematical distance between the sequence of test bits as known to the receiver and the sequence of test bits as received by the receiver, generates reliability information indicative of the reliability of data transmitted over the TDMA communication channel based on the mathematical distance, and generates information estimates of the TDMA communication signal;

wherein the mathematical distance is a Euclidean distance.

7. The system of claim 6, further comprising:

an interleaver for interleaving the test bits with information symbols within each time slot of the TDMA communication channel prior to being transmitted by the transmitter; and a deinterleaver for deinterleaving the reliability information and the information estimates.

8. The system of claim 6, wherein the receiver information estimates include correct data symbols, erroneous data symbols, and erasures, and wherein the receiver corrects the erroneous symbols and erasures to generate the information estimates when the number of errors and erasures does not exceed a threshold value.

* * * * *